US012813097B2

(12) United States Patent
Iimura et al.

(10) Patent No.: US 12,813,097 B2
(45) Date of Patent: Nov. 24, 2026

(54) MULTILAYER BODY FOR IMAGE DISPLAY DEVICE AND IMAGE DISPLAY DEVICE

(71) Applicant: DAI NIPPON PRINTING CO., LTD., Tokyo-to (JP)

(72) Inventors: Keita Iimura, Tokyo-to (JP); Shuji Kawaguchi, Tokyo-to (JP); Kazuki Kinoshita, Tokyo-to (JP); Hidetoshi Iioka, Tokyo-to (JP); Seiji Take, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 490 days.

(21) Appl. No.: 18/285,902

(22) PCT Filed: Apr. 4, 2022

(86) PCT No.: PCT/JP2022/017029

§ 371 (c)(1),
(2) Date: Oct. 6, 2023

(87) PCT Pub. No.: WO2022/215674

PCT Pub. Date: Oct. 13, 2022

(65) Prior Publication Data

US 2024/0121999 A1 Apr. 11, 2024

(30) Foreign Application Priority Data

Apr. 9, 2021 (JP) ................................ 2021-066767

(51) Int. Cl.
*H10K 59/127* (2023.01)
*H10K 59/131* (2023.01)

(52) U.S. Cl.
CPC ....... *H10K 59/1275* (2023.02); *H10K 59/131* (2023.02)

(58) Field of Classification Search
None
See application file for complete search history.

(56) References Cited

U.S. PATENT DOCUMENTS

2012/0206804 A1* 8/2012 Nam ....................... B32B 37/14
359/485.05
2018/0039361 A1* 2/2018 Choi .................... G02B 5/3025
(Continued)

FOREIGN PATENT DOCUMENTS

CN 111725624 A 9/2020
CN 112394824 A 2/2021
JP 2011-066610 A 3/2011
(Continued)

OTHER PUBLICATIONS

Jun. 21, 2022 International Search Report issued in International Patent Application No. PCT/JP2022/017029.
(Continued)

*Primary Examiner* — Alexander G Ghyka
(74) *Attorney, Agent, or Firm* — Oliff PLC

(57) ABSTRACT

A multilayer body for an image display device includes a wiring substrate including a substrate having transparency, and a mesh wiring layer disposed on the substrate; and a dielectric layer stacked on the wiring substrate. The dielectric layer and the substrate have a total thickness of 50 μm or more and 500 μm or less.

8 Claims, 8 Drawing Sheets

(56) References Cited

U.S. PATENT DOCUMENTS

| | | | |
|---|---|---|---|
| 2020/0251807 | A1 | 8/2020 | Oh et al. |
| 2020/0379607 | A1 | 12/2020 | Oh et al. |

FOREIGN PATENT DOCUMENTS

| | | | |
|---|---|---|---|
| JP | 5636735 | B2 | 12/2014 |
| JP | 5695947 | B2 | 4/2015 |
| KR | 10-2018-0016082 | A | 2/2018 |
| KR | 10-2020-0112755 | A | 10/2020 |
| KR | 10-2167154 | B1 | 10/2020 |

OTHER PUBLICATIONS

Oct. 10, 2023 International Preliminary Report on Patentability issued in International Patent Application No. PCT/JP2022/017029.

Dec. 15, 2025 Office Action issued in Taiwanese Patent Application No. 111113357.

Mar. 11, 2025 Extended European Search Report issued in European Patent Application No. 22784657.3.

May 16, 2026 Office Action issued in Korean Patent Application No. 10-2023-7038142.

Jun. 26, 2026 Office Action issued in Chinese Patent Application No. 202280024472.3.

* cited by examiner

MULTILAYER BODY FOR IMAGE DISPLAY DEVICE AND IMAGE DISPLAY DEVICE

TECHNICAL FIELD

Embodiments of the present disclosure relate to a multilayer body for an image display device and an image display device.

BACKGROUND ART

Currently, portable terminal devices such as smartphones and tablets are becoming more sophisticated, smaller, thinner, and lighter. Since these portable terminal devices use a plurality of communication bands, a plurality of antennas corresponding to the communication bands are required. For example, a portable terminal device is equipped with a plurality of antennas such as a telephone antenna, a wireless fidelity (Wi-Fi) antenna, a third generation (3G) antenna, a fourth generation (4G) antenna, a long term evolution (LTE) antenna, a Bluetooth (registered trademark) antenna, and a near field communication (NFC) antenna. However, with miniaturization of such a portable terminal device, the mounting space of the antennas is limited and the degree of freedom of antenna design is narrowed. Moreover, since the antennas are built in the limited space, the radio wave sensitivity is not always satisfactory.

For this reason, a film antenna that can be mounted in a display region of a portable terminal device has been developed. Regarding this film antenna, in a transparent antenna in which an antenna pattern is formed on a transparent base, the antenna pattern is formed by a mesh-like conductor mesh layer including a conductor portion as a formation portion of an opaque conductor layer and a large number of openings as non-formation portions.

CITATION LIST

Patent Literature

PTL 1: Japanese Unexamined Patent Application Publication No. 2011-66610

PTL 2: Japanese Patent No. 5636735

PTL 3: Japanese Patent No. 5695947

Embodiments provide a multilayer body for an image display device and an image display device capable of suppressing deterioration of antenna performance of a wiring substrate due to influence of a metal present in the image display device.

SUMMARY OF INVENTION

A multilayer body for an image display device according to an embodiment includes a wiring substrate including a substrate having transparency, and a mesh wiring layer disposed on the substrate; and a dielectric layer stacked on the wiring substrate. The dielectric layer and the substrate have a total thickness of 50 μm or more and 500 μm or less.

A multilayer body for an image display device according to another embodiment includes a wiring substrate including a substrate having transparency, and a mesh wiring layer disposed on the substrate; and a dielectric layer stacked on the wiring substrate. The dielectric layer has a thickness of 50 μm or more and 500 μm or less.

In the multilayer body for an image display device according to any one of the embodiments, the dielectric layer may have a dielectric constant of 3.5 or less.

In the multilayer body for an image display device according to any one of the embodiments, the dielectric layer may include a polarizing plate.

An image display device according to still another embodiment includes the multilayer body for an image display device according to any one of the embodiments; and a self-luminous display device stacked on a dielectric layer side of the multilayer body for an image display device.

In the image display device according to the embodiment, a touch sensor may be disposed between the self-luminous display device and the dielectric layer of the multilayer body for an image display device.

According to the embodiments of the present disclosure, it is possible to suppress the deterioration of the antenna performance of the wiring substrate due to the influence of the metal present in the image display device.

DESCRIPTION OF EMBODIMENTS

Figure 1:
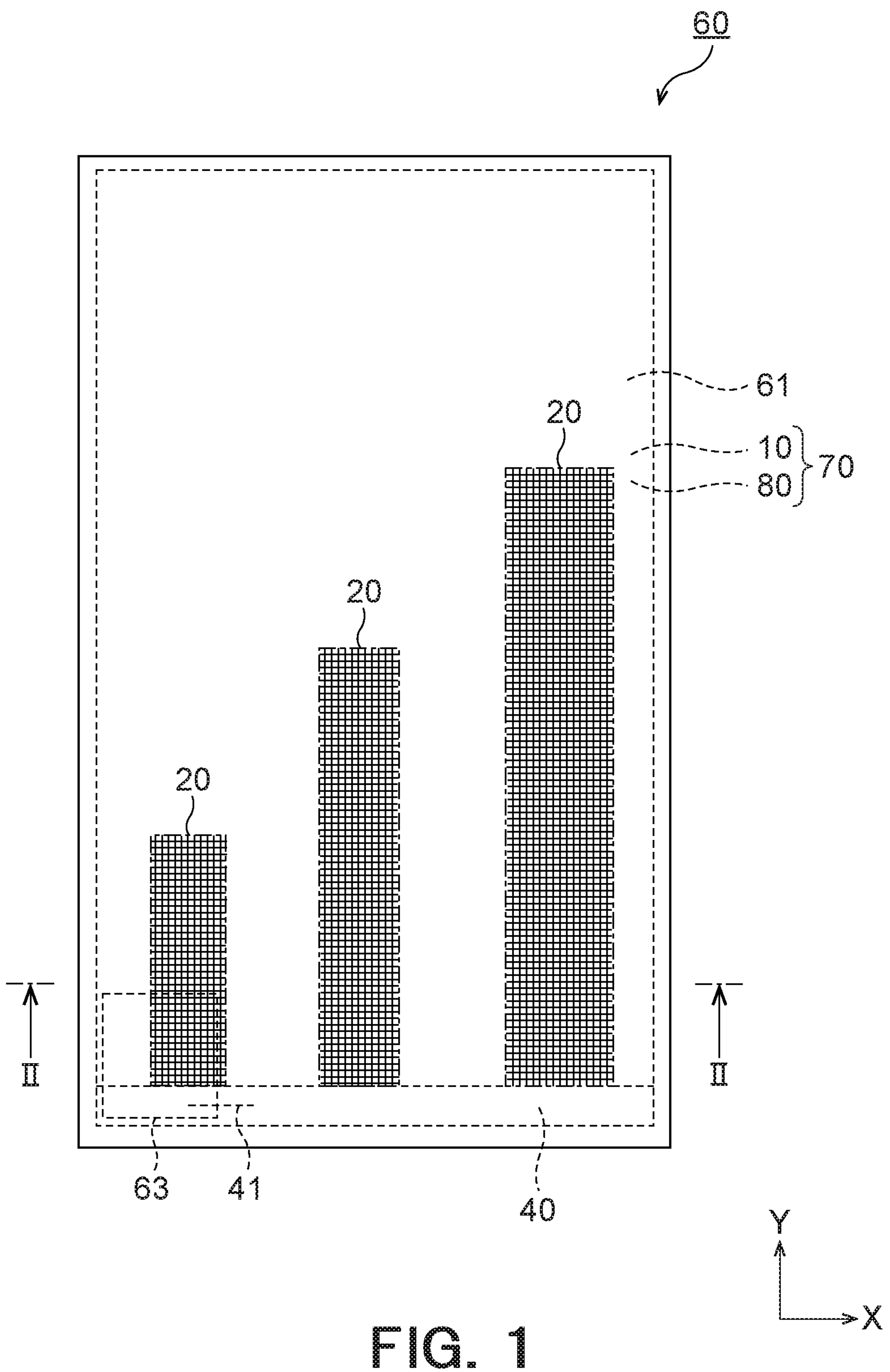
FIG. 1 is a plan view illustrating an image display device according to an embodiment.

First, an embodiment will be described with reference to FIGS. 1 to 8. FIGS. 1 to 8 are views illustrating the present embodiment.

Each of the drawings described below is a schematic view. Thus, the size and shape of each part are appropriately exaggerated for easy understanding. The embodiment can be implemented in an appropriately changed manner within the scope not departing from the technical idea. In the drawings described below, the same portions are denoted by the same reference signs, and a detailed description thereof may be partially omitted. The numerical values such as the dimensions and the material names of the respective members described in the present description are examples as embodiments, and the numerical values and the material names are not limited to the examples and can be appropriately selected and used. In the present description, terms specifying shapes and geometric conditions, for example, terms such as parallel, orthogonal, and perpendicular are interpreted to include substantially the same state in addition to the strict meaning.

In the following embodiment, an "X direction" is a direction parallel to one side of an image display device. A "V direction" is a direction perpendicular to the X direction and parallel to another side of the image display device. A "Z direction" is a direction perpendicular to both the X direction and the Y direction and parallel to a thickness direction of the image display device. A "front surface" is a surface on the plus side in the Z direction, is a light emitting surface side of the image display device, and is a surface facing an observer side. A "back surface" is a surface on the minus side in the Z direction and is a surface on a side opposite to the light emitting surface of the image display device and the surface facing the observer side.

[Configuration of Image Display Device]

A configuration of the image display device according to the present embodiment will be described with reference to FIGS. 1 to 3.

Figure 2:
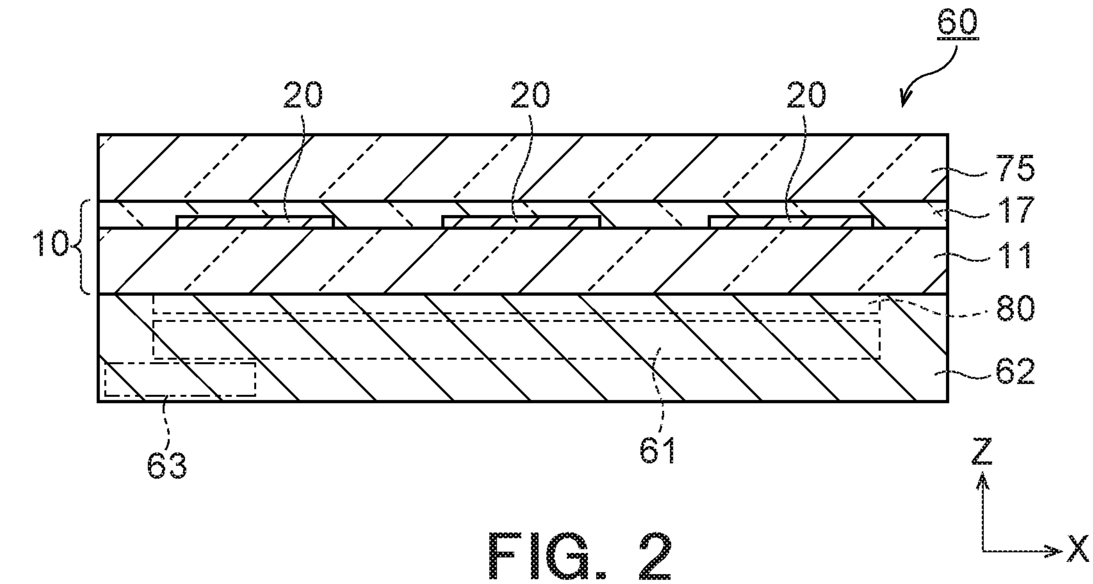
FIG. 2 is a section view illustrating the image display device according to the embodiment (section view taken along line II-II in FIG. 1).

As illustrated in FIGS. 1 and 2, an image display device (display device) 60 includes a wiring substrate 10, a dielectric layer 80, and a self-luminous display device (display) 61. The dielectric layer 80 is stacked on the wiring substrate 10. The self-luminous display device 61 is stacked on the dielectric layer 80. The wiring substrate 10 includes a substrate 11 having transparency, and a mesh wiring layer 20 disposed on the substrate 11. A power feed part 40 is electrically connected to the mesh wiring layer 20. A communication module 63 is disposed on the minus side in the Z direction with respect to the self-luminous display device 61. The wiring substrate 10, the dielectric layer 80, the self-luminous display device 61, and the communication module 63 are accommodated in a housing 62.

In the image display device 60 illustrated in FIGS. 1 and 2, radio waves of a predetermined frequency can be transmitted and received via the communication module 63, and communication can be performed. The communication module 63 may include any one of a telephone antenna, a Wi-Fi antenna, a 3G antenna, a 4G antenna, a 5G antenna, an LTE antenna, a Bluetooth (registered trademark) antenna, an NFC antenna, and the like. Examples of such an image display device 60 include portable terminal devices such as a smartphone and a tablet. Details of the wiring substrate 10 will be described later.

Next, a layer configuration of the image display device 60 will be described with reference to FIG. 3.

Figure 3:
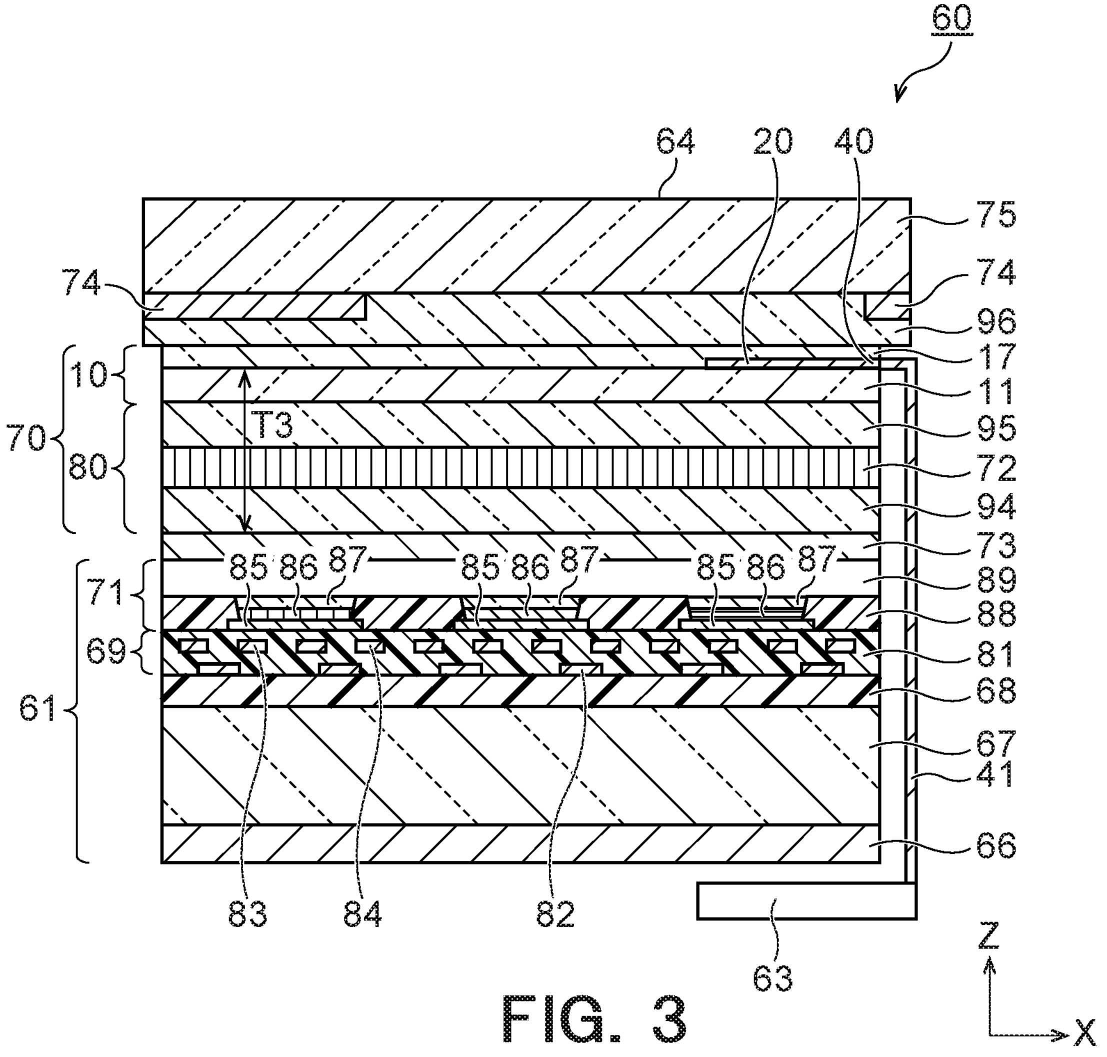
FIG. 3 is a view illustrating a section configuration of the image display device according to the embodiment.

As illustrated in FIG. 3, the image display device 60 has a light emitting surface 64. The image display device 60 includes the wiring substrate 10 and the communication module 63. The wiring substrate 10 is located on a light emitting surface 64 side (the plus side in the Z direction) with respect to the self-luminous display device 61. The communication module 63 is located on a side (the minus side in the Z direction) opposite to the light emitting surface 64 with respect to the self-luminous display device 61. FIG. 3 mainly illustrates sections of the wiring substrate 10, the self-luminous display device 61, and the communication module 63, but omits illustration of the housing 62 and the like.

The self-luminous display device 61 is, for example, an organic electro luminescence (EL) display device. The self-luminous display device 61 includes a metal layer 66, a support base 67, a resin base 68, a thin film transistor (TFT) 69, and an organic EL layer 71 in this order from the side (the minus side in the Z direction) opposite to the light emitting surface 64. A touch sensor 73 is disposed on the self-luminous display device 61. A polarizing plate 72 is disposed on the touch sensor 73 via a first transparent adhesive layer 94. The wiring substrate 10 is disposed on the polarizing plate 72 via a second transparent adhesive layer 95. A decorative film 74 and a cover glass (surface protective plate) 75 are disposed on the wiring substrate 10 via a third transparent adhesive layer 96.

The self-luminous display device 61 is not limited to the organic EL display device as long as it is a display device having a function of emitting light by itself. For example, a micro LED display device including a micro LED element (light emitter) may be used.

The metal layer 66 is located on the side (the minus side in the Z direction) opposite to the light emitting surface 64 with respect to an organic light emitting layer (light emitter) 86 of the organic EL layer 71. The metal layer 66 serves to protect the self-luminous display device 61 from electromagnetic waves emitted by other electronic devices (not illustrated) located outside the self-luminous display device 61. The metal layer 66 may be made of a metal having proper conductivity such as copper. The metal layer 66 may have a thickness of, for example, 1 μm or more and 100 μm or less, and preferably 10 μm or more and 50 μm or less.

The support base 67 is disposed on the metal layer 66. The support base 67 supports the entire self-luminous display device 61 and may be, for example, a film having flexibility. For example, polyethylene terephthalate can be used as the material of the support base 67. The support base 67 may have a thickness of, for example, 75 μm or more and 300 μm or less, and preferably 100 μm or more and 200 μm or less.

The resin base 68 is disposed on the support base 67. The resin base 68 supports the thin film transistor 69, the organic EL layer 71, and the like, and is a flat layer having flexibility. The resin base 68 may be formed by coating using a method such as a die coating method, an inkjet method, a spray coating method, a plasma CVD method or a thermal CVD method, a capillary coating method, a slit and spin method, or a center dispensing method. For example, colored polyimide can be used as the resin base 68. The resin base 68 may have a thickness of, for example, 7 μm or more and 30 μm or less, and preferably 10 μm or more and 20 μm or less.

The thin film transistor (TFT) 69 is disposed on the resin base 68. The thin film transistor 69 is for driving the organic EL layer 71, and controls a voltage to be applied to a first electrode 85 and a second electrode 87 (described later) of the organic EL layer 71. The thin film transistor 69 may have a thickness of, for example, 7 μm or more and 30 μm or less, and preferably 10 μm or more and 20 μm or less.

The thin film transistor 69 includes an insulating layer 81, and a gate electrode 82, a source electrode 83, and a drain electrode 84 that are embedded in the insulating layer 81. The insulating layer 81 is constituted by stacking, for example, a material having an electrical insulating property, and any one of known organic materials and inorganic materials can be used. As the material of the insulating layer 81, for example, silicon oxide ($SiO_2$), silicon nitride ($SiN_x$), silicon oxynitride (SiON), silicon nitride (SiN), or aluminum oxide ($AlO_x$) may be used. As the gate electrode 82, for example, a molybdenum-tungsten alloy, a multilayer body of titanium and aluminum, or the like can be employed. As the source electrode 83 and the drain electrode 84, for example, a multilayer body of titanium and aluminum, a multilayer body of copper-manganese, copper, and molybdenum, or the like can be used.

The organic EL layer 71 is disposed on the thin film transistor 69 and is electrically connected to the thin film transistor 69. The organic EL layer 71 includes the first electrode (reflective electrode, anode electrode) 85, the organic light emitting layer (light emitter) 86, and the second electrode (transparent electrode, cathode electrode) 87. The first electrode 85 is disposed on the resin base 68. The organic light emitting layer 86 is disposed on the first electrode 85. The second electrode 87 is disposed on the organic light emitting layer 86. On the thin film transistor 69, a bank 88 is formed so as to cover edges of the first electrode 85. An opening corresponding to each pixel is formed by being surrounded by the bank 88, and the above-described organic light emitting layer 86 is disposed in the opening. The first electrode 85, the organic light emitting layer 86, the second electrode 87, and the bank 88 are sealed with a sealing resin 89. The first electrode 85 constitutes an anode electrode, and the second electrode 87 constitutes a cathode electrode. However, the polarities of the first electrode 85 and the second electrode 87 are not particularly limited.

The first electrode 85 is formed on the resin base 68 by a method such as a sputtering method, a vapor deposition method, an ion plating method, or a CVD method. As the material of the first electrode 85, it is preferable to use a material into which positive holes can be efficiently injected, and examples thereof include metal materials such as aluminum, chromium, molybdenum, tungsten, copper, silver, gold, and alloys thereof.

The organic light emitting layer (light emitter) 86 has a function of emitting light when holes and electrons are injected and recoupled to generate an excited state. The organic light emitting layer 86 is formed on the first electrode 85 by a vapor deposition method, a nozzle application method of applying a liquid to be applied from a nozzle, or a printing method such as inkjet printing. The organic light emitting layer 86 preferably contains a fluorescent organic substance configured to emit light when a predetermined voltage is applied, and examples thereof include a quinolinol complex, an oxazole complex, various laser dyes, and polyparaphenylene vinylene. The organic light emitting layer 86 includes a plurality of organic light emitting layers 86 each being any one of a red light emitting layer, a green light emitting layer, and a blue light emitting layer. The red light emitting layer, the green light emitting layer, and the blue light emitting layer are repeatedly arranged.

The second electrode (transparent electrode) 87 is formed on the organic light emitting layer 86. The second electrode 87 may be formed by a method such as a sputtering method, a vapor deposition method, an ion plating method, or a CVD method. As the material of the second electrode 87, it is preferable to use a material into which electrons are easily injected and that has proper light transmittance. Specific examples thereof include indium tin oxide (ITO), indium zinc oxide (120), lithium oxide, cesium carbonate, and the like.

The bank 88 is formed using an organic material having an insulating property such as a resin. Examples of the organic material used for forming the bank 88 include acrylic-based resins, polyimide-based resins, and novolac phenol resins.

The sealing resin 89 is disposed on the bank 88 and the second electrode 87. The sealing resin 89 protects the organic light emitting layer 86. As the sealing resin 89, for example, a silicone resin or an acrylic-based resin can be used. The sealing resin 89 may have a thickness of, for example, 7 μm or more and 30 μm or less, and preferably 10 μm or more and 20 μm or less.

Light emitted from the organic EL layer 71 is extracted from the light emitting surface 64. That is, the light from the organic EL layer 71 is extracted from above the sealing resin 89. As described above, the self-luminous display device 61 according to the present embodiment is a so-called top emission display device.

The touch sensor 73 is disposed on the organic EL layer 71. The touch sensor 73 detects and outputs contact position data when a finger or the like is brought into contact with the self-luminous display device 61. The touch sensor 73 is configured to include a metal portion such as copper. The touch sensor 73 may have a thickness of, for example, 0.1 μm or more and 3.0 μm or less, and preferably 0.2 μm or more and 0.5 μm or less.

The first transparent adhesive layer 94 is an adhesive layer to cause the polarizing plate 72 to adhere to the touch sensor 73. The first transparent adhesive layer 94 may be an optical clear adhesive (OCA) layer. The OCA layer is, for example, a layer produced as follows. First, a composition for a curable adhesive layer in a liquid form including a polymerizable compound is applied onto a release film of such as polyethylene terephthalate (PET), and is cured using, for example, ultraviolet rays (UV) or the like to obtain an OCA sheet. The composition for a curable adhesive layer may be an optical pressure-sensitive adhesive of such as an acrylic-based resin, a silicone-based resin, or an urethane-based resin. After the OCA sheet is bonded to an object, the release film is peeled off and removed to obtain the OCA layer. The first transparent adhesive layer 94 which is the OCA layer has optical transparency. The first transparent adhesive layer 94 may have a thickness of, for example, 10 μm or more and 50 μm or less, and preferably 15 μm or more and 30 μm or less.

The polarizing plate 72 is disposed on the touch sensor 73 via the first transparent adhesive layer 94. The polarizing plate 72 filters light from the organic EL layer 71. The polarizing plate 72 may be a circular polarizing plate. The polarizing plate 72 may include a polarizer and a pair of protective films bonded to both surfaces of the polarizer and having light transmissivity. The polarizing plate 72 may have a thickness of, for example, 15 μm or more and 200 μm or less, and preferably 50 μm or more and 150 μm or less.

The second transparent adhesive layer 95 is an adhesive layer that causes the wiring substrate 10 to adhere to the polarizing plate 72. Similarly to the first transparent adhesive layer 94, the second transparent adhesive layer 95 may be an optical clear adhesive (OCA) layer. The second transparent adhesive layer 95 may have a thickness of, for example, 15 μm or more and 150 μm or less, and preferably 20 μm or more and 120 μm or less.

As described above, the wiring substrate 10 is disposed on the light emitting surface 64 side with respect to the self-luminous display device 61. In this case, the wiring substrate 10 is positioned between the polarizing plate 72 and the decorative film 74. The wiring substrate 10 includes the substrate 11 having transparency, and the mesh wiring layer 20 disposed on the substrate 11. The power feed part 40 is electrically connected to the mesh wiring layer 20. The power feed part 40 is electrically connected to the communication module 63 via a connection line 41. The substrate 11 may have a thickness of, for example, 10 μm or more and 200 μm or less, and preferably 30 μm or more and 120 μm or less. Details of the wiring substrate 10 will be described later.

In the present embodiment, the dielectric layer 80 is stacked on a substrate 11 side of the wiring substrate 10. The dielectric layer 80 is a layer that does not substantially include a metal and has an insulating property. In this case, the dielectric layer 80 includes the first transparent adhesive layer 94, the polarizing plate 72, and the second transparent adhesive layer 95 described above. A layer including a metal is adjacent to a surface of the dielectric layer 80 on a side opposite to the wiring substrate 10. Specifically, the touch sensor 73 is directly stacked on the dielectric layer 80.

In this case, the dielectric layer 80 and the substrate 11 have a total thickness $T_3$ of 50 μm or more and 500 μm or less, and preferably 100 μm or more and 400 μm or less.

By setting the total thickness $T_3$ of the dielectric layer 80 and the substrate 11 to 50 μm or more, a layer of a dielectric having a thickness of 50 μm or more is formed between the mesh wiring layer 20 of the wiring substrate 10 and a metal layer (touch sensor 73) closest to the mesh wiring layer 20. In this case, it is possible to sufficiently ensure the distance (the distance in the thickness direction) between the mesh wiring layer 20 and the touch sensor 73. Accordingly, it is possible to suppress electrical coupling between the metal of the touch sensor 73 and the mesh wiring layer 20, and to suppress weakening of radiation from the mesh wiring layer 20 to the outside of the housing 62. As a result, it is possible to suppress deterioration of a function of the mesh wiring layer 20 such as an antenna function. Also, by setting the total thickness $T_3$ of the dielectric layer 80 and the substrate 11 to 500 μm or less, it is possible to suppress an excessive increase in the thickness of the entire image display device 60.

Depending on the layer configuration of the image display device 60, the dielectric layer 80 does not have to include all of the first transparent adhesive layer 94, the polarizing plate 72, and the second transparent adhesive layer 95. That is, one or more of the first transparent adhesive layer 94, the polarizing plate 72, and the second transparent adhesive layer 95 may be omitted. Alternatively, a layer functioning as a dielectric other than the first transparent adhesive layer 94, the polarizing plate 72, and the second transparent adhesive layer 95 may be provided. In any case, the dielectric layer 80 has a function as an insulator that does not substantially include a conductor such as a metal.

The dielectric layer 80 has a dielectric constant of preferably 3.5 or less, and more preferably 3.0 or less. By limiting the dielectric constant of the dielectric layer 80, it is possible to more effectively suppress the deterioration of the function of the mesh wiring layer 20 such as the antenna function described above.

As illustrated in FIG. 3, the above-described wiring substrate 10 and the dielectric layer 80 stacked on the substrate 11 side of the wiring substrate 10 constitute a multilayer body 70 for an image display device. In the present embodiment, such a multilayer body 70 for an image display device is also provided.

The third transparent adhesive layer 96 is an adhesive layer that causes the wiring substrate 10 to adhere to the decorative film 74 and the cover glass 75. Similarly to the first transparent adhesive layer 94 and the second transparent adhesive layer 95, the third transparent adhesive layer 96 may be an optical clear adhesive (OCA) layer. The third transparent adhesive layer 96 may have a thickness of, for example, 20 μm or more and 200 μm or less, and preferably 30 μm or more and 180 μm or less.

The decorative film 74 is disposed on the wiring substrate 10. In the decorative film 74, for example, a portion overlapping with the display region of the self-luminous display device 61 when viewed from the observer side is entirely or partially opened, and a portion other than the display region is shielded from light. That is, the decorative film 74 is disposed so as to cover end portions of the self-luminous display device 61 when viewed from the observer side.

The cover glass (surface protective plate) 75 is disposed on the decorative film 74. The cover glass 75 is a member made of glass that transmits light. The cover glass 75 has a plate shape and may have a rectangular shape in a plan view. The cover glass 75 may have a thickness of, for example, 200 μm or more and 1000 μm or less, and preferably 300 μm or more and 700 μm or less. The planar shape of the cover glass 75 may be larger than the planar shape of each of the wiring substrate 10, the dielectric layer 80, and the self-luminous display device 61.

[Configuration of Wiring Substrate]

Next, the configuration of the wiring substrate will be described with reference to FIGS. 4 to 7. FIGS. 4 to 7 are views illustrating the wiring substrate according to the present embodiment.

Figure 4:
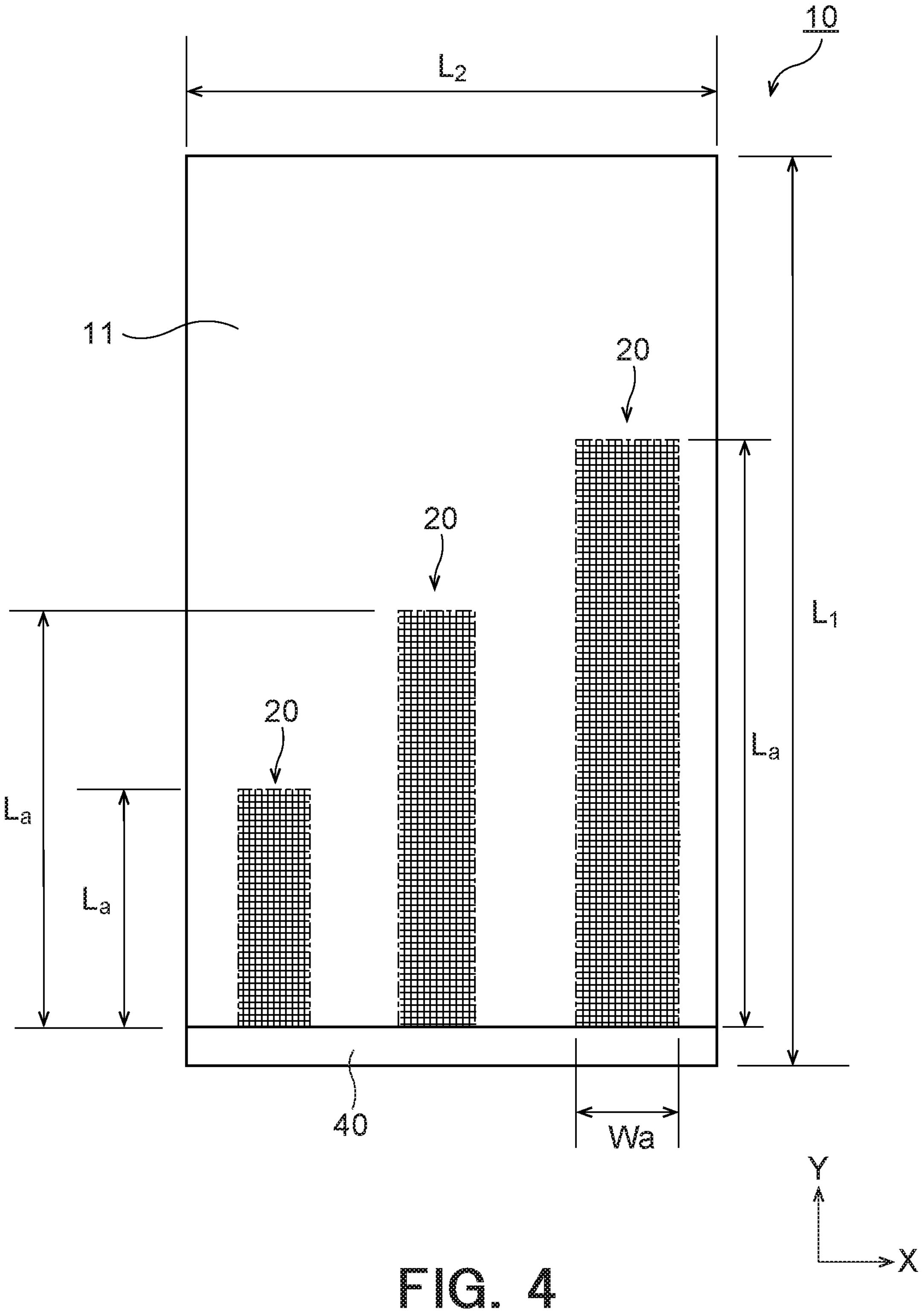
FIG. 4 is a plan view illustrating a wiring substrate.

As illustrated in FIG. 4, the wiring substrate 10 according to the present embodiment is used for the image display device 60 (see FIGS. 1 to 3), and is disposed between the cover glass 75 and the dielectric layer 80, on the light emitting surface 64 side with respect to the organic light emitting layer (light emitter) 86 as described above. Such a wiring substrate 10 includes the substrate 11 having transparency, and the mesh wiring layer 20 disposed on the substrate 11. The power feed part 40 is electrically connected to the mesh wiring layer 20.

The substrate 11 has a substantially rectangular shape in a plan view, a longitudinal direction thereof is parallel to the Y direction, and a lateral direction thereof is parallel to the X direction. The substrate 11 has transparency and a substantially flat plate shape, and has a substantially uniform thickness as a whole. The substrate 11 has a length $L_1$ in the longitudinal direction (Y direction) that can be selected, for example, in a range of 100 mm or more and 200 mm or less, and the substrate 11 has a length $L_2$ in the lateral direction (X direction) that can be selected, for example, in a range of 50 mm or more and 100 mm or less. The substrate 11 may have rounded corner portions.

The material of the substrate 11 may be a material having transparency in a visible light region and an electrical insulating property. In the present embodiment, the material of the substrate 11 is polyethylene terephthalate, but is not limited thereto. As the material of the substrate 11, for example, it is preferable to use an organic insulating material. Examples of the organic insulating material include polyester-based resins such as polyethylene terephthalate, acrylic-based resins such as polymethyl methacrylate, polycarbonate-based resins, polyimide-based resins, polyolefin-based resins such as cycloolefin polymers, and cellulose-based resin materials such as triacetylcellulose. As the material of the substrate 11, glass, ceramics, or the like can be appropriately selected depending on the application. Although an example in which the substrate 11 is constituted of a single layer is illustrated, the substrate 11 is not limited thereto and may have a structure in which a plurality of bases or layers are stacked. The substrate 11 may have a film shape or a plate shape. Thus, the thickness of the substrate 11 is not particularly limited and can be appropriately selected depending on the application. For example, the substrate 11 may have a thickness (Z direction) $T_1$ (see FIG. 6) in a range of 10 μm or more and 200 μm or less.

In the present embodiment, the mesh wiring layer 20 is an antenna pattern having a function as an antenna. In FIG. 4, a plurality of (three) mesh wiring layers 20 are formed on the substrate 11 and correspond to respective frequency bands different from each other. That is, the plurality of mesh wiring layers 20 have lengths (lengths in the Y direction) $L_a$ different from each other, and have lengths corresponding to respective specific frequency bands. The lower the corresponding frequency band is, the longer the length $L_a$ of the mesh wiring layer 20 is. Each mesh wiring layer 20 may correspond to any one of a telephone antenna, a Wi-Fi antenna, a 3G antenna, a 4G antenna, a 5G antenna, an LTE antenna, a Bluetooth (registered trademark) antenna, an NFC antenna, and the like.

Each mesh wiring layer 20 has a substantially rectangular shape in a plan view. A longitudinal direction of each mesh wiring layer 20 is parallel to the Y direction, and a lateral direction thereof is parallel to the X direction. Each mesh wiring layer 20 has a length $L_a$ in the longitudinal direction (Y direction) that can be selected, for example, in a range of 3 mm or more and 100 mm or less, and each mesh wiring layer 20 has a width $W_a$ in the lateral direction (X direction) that can be selected, for example, in a range of 1 mm or more and 10 mm or less.

In each mesh wiring layer 20, metal wires are formed in a lattice shape or a mesh shape, and have a repetitive pattern in the X direction and the Y direction. That is, the mesh wiring layer 20 has a pattern shape constituted by a portion (second direction wire 22) extending in the X direction and a portion (first direction wire 21) extending in the Y direction.

Figure 5:
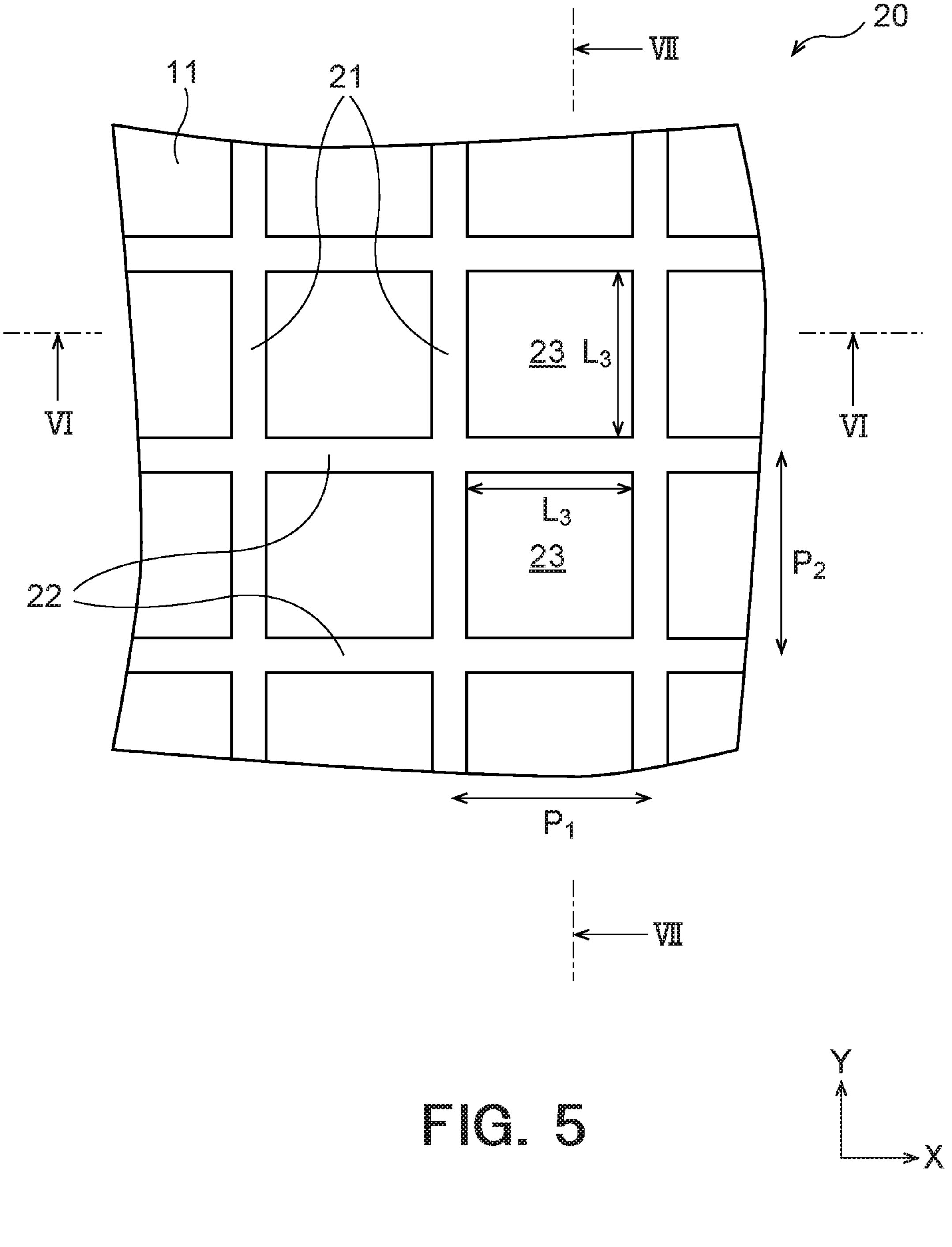
FIG. 5 is an enlarged plan view illustrating a mesh wiring layer of the wiring substrate.

As illustrated in FIG. 5, each mesh wiring layer 20 includes a plurality of first direction wires (antenna wires) 21 and a plurality of second direction wires (antenna coupling wires) 22. The plurality of first direction wires 21 each function as an antenna. The plurality of second direction wires 22 each couple the plurality of first direction wires 21. Specifically, the plurality of first direction wires 21 and the plurality of second direction wires 22 are integrated as a whole to form a lattice shape or a mesh shape. Each first direction wire 21 extends in a direction (longitudinal direction, Y direction) corresponding to the frequency band of the antenna. Each second direction wire 22 extends in a direction (width direction, X direction) orthogonal to the first direction wire 21. The first direction wire 21 has a length $L_a$ (the length of the mesh wiring layer 20 described above, see FIG. 4) corresponding to a predetermined frequency band, and thus mainly exhibits a function as an antenna. In contrast, the second direction wire 22 couples the first direction wires 21 to each other, thereby serving to suppress a defect that the first direction wire 21 is disconnected or the first direction wire 21 and the power feed part 40 are no longer electrically connected to each other.

In each mesh wiring layer 20, a plurality of openings 23 are formed by being surrounded by the first direction wires 21 adjacent to each other and the second direction wires 22 adjacent to each other. The first direction wires 21 and the second direction wires 22 are arranged at equal intervals. That is, the plurality of first direction wires 21 may be arranged at equal intervals to each other, and a pitch $P_1$ thereof may be in a range of, for example, 0.01 mm or more and 1 mm or less. The plurality of second direction wires 22 may be arranged at equal intervals to each other, and a pitch $P_2$ thereof may be in a range of, for example, 0.01 mm or more and 1 mm or less. Since the plurality of first direction wires 21 and the plurality of second direction wires 22 are arranged at equal intervals in this way, there is no variation in the size of the openings 23 in each mesh wiring layer 20, and the mesh wiring layer 20 can be made difficult to be visually recognized with the naked eye. The pitch $P_1$ of the first direction wires 21 is equal to the pitch $P_2$ of the second direction wires 22. Accordingly, each opening 23 has a substantially square shape in a plan view, and the substrate 11 having transparency is exposed from each opening 23. Thus, by increasing the area of each opening 23, the transparency of the wiring substrate 10 as a whole can be enhanced. One side of each opening 23 may have a length $L_3$, for example, in a range of 0.01 mm or more and 1 mm or less. Although each first direction wire 21 and each second direction wire 22 are orthogonal to each other, the arrangement is not limited thereto, and they may intersect with each other at an acute angle or an obtuse angle. Although it is preferable that the shapes of the openings 23 are the same shape and have the same size over the entire surface, the shapes do not have to be uniform over the entire surface and, for example, may be changed depending on the location.

Figure 6:
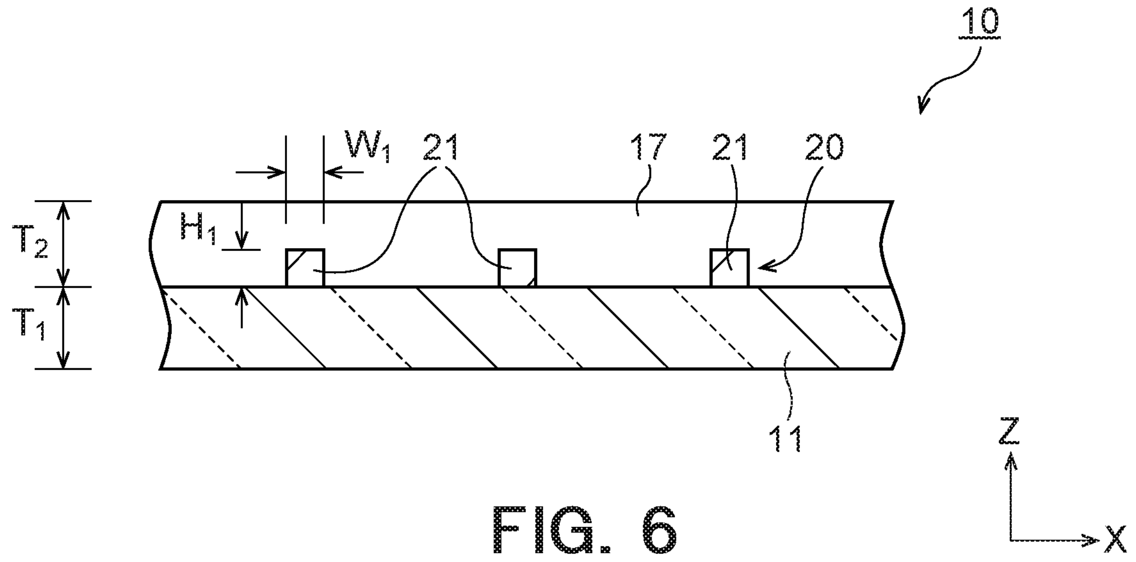
FIG. 6 is a section view illustrating the wiring substrate (section view taken along line VI-VI in FIG. 5).
Figure 7:
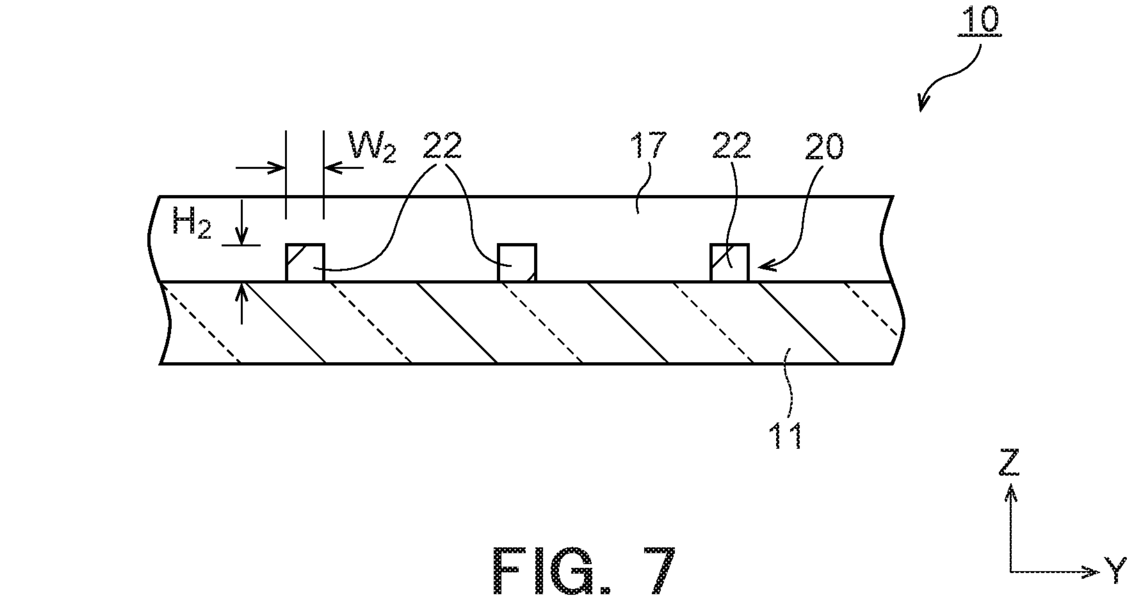
FIG. 7 is a section view illustrating the wiring substrate (section view taken along line VII-VII in FIG. 5).

As illustrated in FIG. 6, each first direction wire 21 has a substantially rectangular shape or a substantially square shape in a section (X-direction section) perpendicular to the longitudinal direction thereof. In this case, the section shape of the first direction wire 21 is substantially uniform in the longitudinal direction (Y direction) of the first direction wire 21. As illustrated in FIG. 7, each second direction wire 22 has a substantially rectangular shape or a substantially square shape in a section (Y-direction section) perpendicular to the longitudinal direction thereof, and the shape is substantially the same as the shape of the section (X-direction section) of the first direction wire 21 described above. In this case, the section shape of the second direction wire 22 is substantially uniform in the longitudinal direction (X direction) of the second direction wire 22. The section shapes of the first direction wire 21 and the second direction wire 22 do not have to be a substantially rectangular shape or a substantially square shape. The section shapes of the first direction wire 21 and the second direction wire 22 may be, for example, a substantially trapezoidal shape in which a front surface side (the plus side in the Z direction) is narrower than a back surface side (the minus side in the Z direction), or a shape in which side surfaces located on both sides in the longitudinal direction are curved.

In the present embodiment, a line width $W_1$ (a length in the X direction, see FIG. 6) of the first direction wire 21 and a line width $W_2$ (a length in the Y direction, see FIG. 7) of the second direction wire 22 are not particularly limited, and can be appropriately selected depending on the application. For example, the line width $W_1$ of the first direction wire 21 can be selected in a range of 0.1 μm or more and 5.0 μm or less, and is preferably 0.2 μm or more and 2.0 μm or less. The line width $W_2$ of the second direction wire 22 can be selected in a range of 0.1 μm or more and 5.0 μm or less, and is preferably 0.2 μm or more and 2.0 μm or less. A height $H_1$ (a length in the Z direction, see FIG. 6) of the first direction wire 21 and a height $H_2$ (a length in the Z direction, see FIG. 7) of the second direction wire 22 are not particularly limited, and can be appropriately selected depending on the application. Each of the height $H_1$ of the first direction wire 21 and the height $H_2$ of the second direction wire 22 can be selected in a range of, for example, 0.1 μm or more and 5.0 μm or less, and is preferably 0.2 μm or more and 2.0 μm or less.

The material of the first direction wire 21 and the second direction wire 22 may be a metal material having conductivity. In the present embodiment, the material of the first direction wire 21 and the second direction wire 22 is copper, but is not limited thereto. As the material of the first direction wire 21 and the second direction wire 22, for example, a metal material (including an alloy) such as gold, silver, copper, platinum, tin, aluminum, iron, or nickel can be used. The first direction wire 21 and the second direction wire 22 may be a plated layer formed by an electrolytic plating method.

An aperture ratio At of the entire mesh wiring layer 20 may be, for example, in a range of 87% or more and less than 100%. By setting the aperture ratio At of the entire wiring substrate 10 in this range, the conductivity and transparency of the wiring substrate 10 can be ensured. The aperture ratio refers to a proportion (%) of an area of an opening region (a region in which metal portions such as the first direction wire 21 and the second direction wire 22 are not present and the substrate 11 is exposed) with respect to a unit area of a predetermined region (for example, the entire region of the mesh wiring layer 20).

As illustrated in FIGS. 6 and 7, a protective layer 17 is formed on a front surface of the substrate 11 so as to cover the mesh wiring layer 20. The protective layer 17 protects the mesh wiring layer 20, and is formed on substantially the entire front surface of the substrate 11. Examples of the material of the protective layer 17 include acrylic resins such as polymethyl (meth)acrylate and polyethyl (meth)acrylate, modified resins thereof, and copolymers thereof; polyvinyl resins such as polyester, polyvinyl alcohol, polyvinyl acetate, polyvinyl acetal, and polyvinyl butyral, and copolymers thereof; and colorless transparent insulating resins such as polyurethane, epoxy resin, polyamide, and chlorinated polyolefin. The protective layer 17 has a thickness $T_2$ that can be selected in a range of 0.3 μm or more and 100 μm or less. The protective layer 17 may be formed so as to cover at least the mesh wiring layer 20 of the substrate 11. Alternatively, the protective layer 17 does not have to be formed.

Referring to FIG. 4 again, the power feed part 40 is electrically connected to the mesh wiring layer 20. The power feed part 40 is a conductive thin plate member having a substantially rectangular shape. A longitudinal direction of the power feed part 40 is parallel to the X direction, and a lateral direction of the power feed part 40 is parallel to the Y direction. The power feed part 40 is disposed at an end portion of the substrate 11 in the longitudinal direction (a minus side end portion in the Y direction). As the material of the power feed part 40, for example, a metal material (including an alloy) such as gold, silver, copper, platinum, tin, aluminum, iron, or nickel can be used. When the wiring substrate 10 is incorporated in the image display device 60 (see FIG. 1), the power feed part 40 is electrically connected to the communication module 63 of the image display device 60. Although the power feed part 40 is provided on the front surface of the substrate 11, the arrangement of the power feed part 40 is not limited thereto, and the power feed part 40 may be partially or entirely located outside a peripheral edge of the substrate 11. Alternatively, the power feed part 40 may be flexibly formed so that the power feed part 40 extends to a side surface or a back surface of the image display device 60, so that the power feed part 40 can be electrically connected on the side surface or the back surface side.

[Method of Manufacturing Wiring Substrate]

Figure 8:
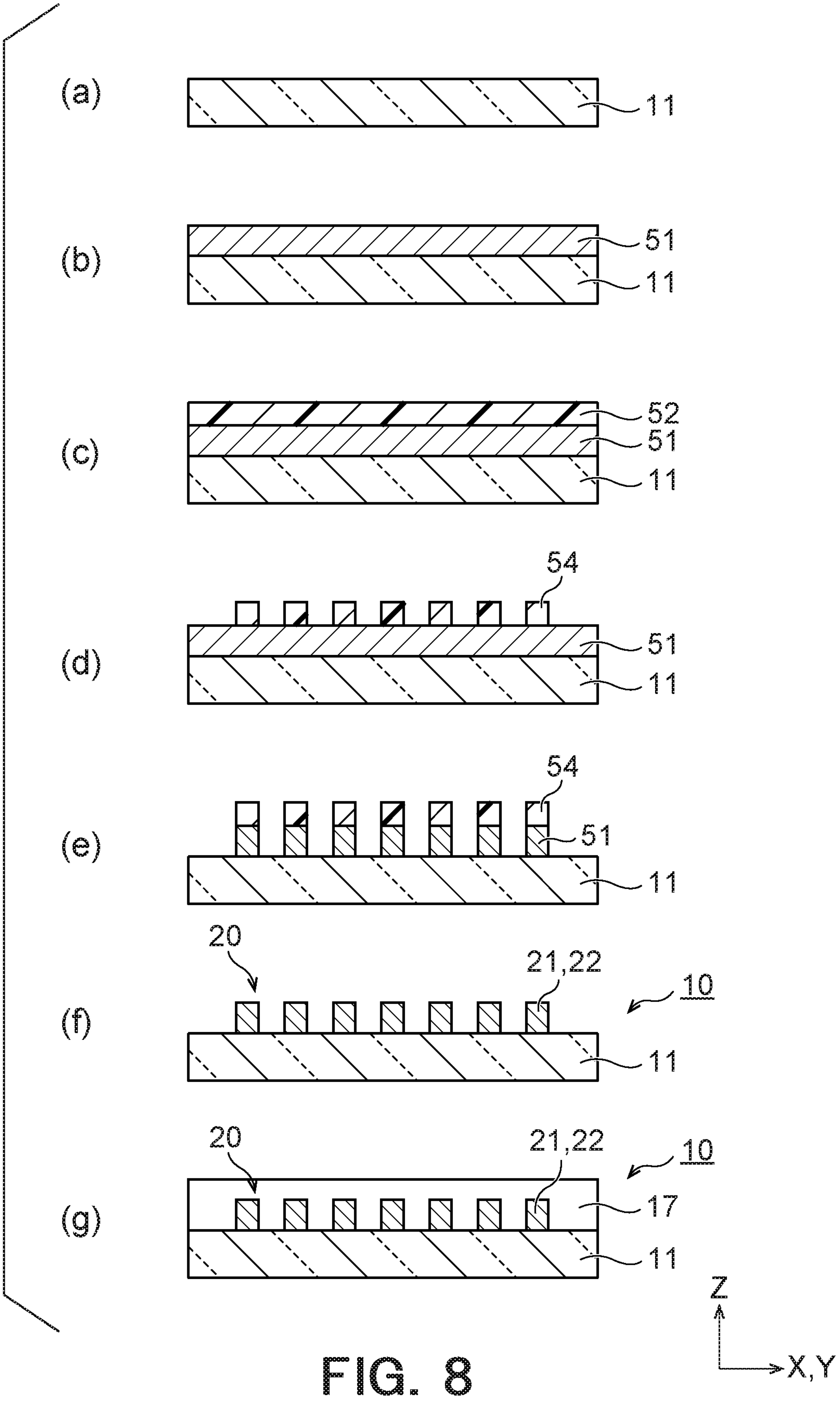
FIG. 8(*a*) to FIG. 8(*g*) are section views illustrating a method of manufacturing the wiring substrate according to the embodiment.

Next, referring to FIG. 8(*a*) to FIG. (g), a method of manufacturing the wiring substrate according to the present embodiment will be described. FIG. 8(*a*) to FIG. 8(*g*) are section views illustrating a method of manufacturing the wiring substrate according to the present embodiment.

As illustrated in FIG. 8(*a*), a substrate 11 having transparency is prepared.

Next, a mesh wiring layer 20 including a plurality of first direction wires 21 and a plurality of second direction wires 22 coupling the plurality of first direction wires 21 is formed on the substrate 11.

At this time, first, as illustrated in FIG. 8(*b*), a metal foil 51 is stacked on substantially an entire region of a front surface of the substrate 11. In the present embodiment, the metal foil 51 may have a thickness of 0.1 μm or more and 5.0 μm or less. In the present embodiment, the metal foil 51 may include copper.

Next, as illustrated in FIG. 8(*c*), a photo-curable insulating resist 52 is supplied to substantially an entire region of a front surface of the metal foil 51. Examples of the photo-curable insulating resist 52 include organic resins such as acrylic resins and epoxy-based resins.

Then, as illustrated in FIG. 8(*d*), an insulating layer 54 is formed by a photolithography method. In this case, the photo-curable insulating resist 52 is patterned by a photolithography method to form the insulating layer 54 (resist pattern). At this time, the insulating layer 54 is formed so that the metal foil 51 corresponding to the first direction wires 21 and the second direction wires 22 is exposed.

Next, as illustrated in FIG. 8(*e*), the metal foil 51 located on a portion of the front surface of the substrate 11 not covered with the insulating layer 54 is removed. At this time, the metal foil 51 is etched so as to expose the front surface of the substrate 11 by performing a wet treatment using ferric chloride, cupric chloride, a strong acid such as sulfuric acid or hydrochloric acid, a persulfate, hydrogen peroxide, an aqueous solution thereof, or a combination thereof.

Then, as illustrated in FIG. 8(*f*), the insulating layer 54 is removed. In this case, the insulating layer 54 on the metal foil 51 is removed by a wet treatment using a permanganate solution, N-methyl-2-pyrrolidone, an acid solution, an alkali solution, or the like, or a dry treatment using oxygen plasma.

In this way, the wiring substrate 10 including the substrate 11 and the mesh wiring layer 20 provided on the substrate 11 is obtained. In this case, the mesh wiring layer 20 includes a first direction wire 21 and a second direction wire 22.

Thereafter, as illustrated in FIG. 8(*g*), a protective layer 17 is formed so as to cover the mesh wiring layer 20 on the substrate 11. As a method of forming the protective layer 17, roll coating, gravure coating, gravure reverse coating, micro-gravure coating, slot-die coating, die coating, knife coating, inkjet coating, dispenser coating, kiss coating, spray coating, screen printing, offset printing, or flexographic printing may be used.

Operations of Present Embodiment

Next, operations of the present embodiment configured as described above will be described.

As illustrated in FIGS. 1 to 3, the wiring substrate 10 is incorporated in the image display device 60 including the self-luminous display device 61. The wiring substrate 10 is disposed on the self-luminous display device 61. The mesh wiring layer 20 of the wiring substrate 10 is electrically connected to the communication module 63 of the image display device 60 via the power feed part 40. In this way, radio waves of a predetermined frequency can be transmitted and received via the mesh wiring layer 20, and communication can be performed using the image display device 60.

When radio waves are transmitted and received using the mesh wiring layer 20 of the wiring substrate 10, if a metal is present in the vicinity of the mesh wiring layer 20, the antenna performance of the mesh wiring layer 20 may deteriorate. That is, the metal and the mesh wiring layer 20 may be electrically strongly coupled to each other and radiation of radio waves to the outside of the housing 62 may be weakened.

In contrast, according to the present embodiment, as described above, the dielectric layer 80 is stacked on the substrate 11 side of the wiring substrate 10, and the total thickness $T_3$ of the dielectric layer 80 and the substrate 11 is 50 μm or more. In this case, the distance between the mesh wiring layer 20 and the touch sensor 73 that is the metal layer closest to the mesh wiring layer 20 is sufficiently increased. Accordingly, the metal included in the touch sensor 73 and the mesh wiring layer 20 are not strongly electrically coupled to each other, and it is possible to suppress weakening of the radiation of radio waves to the outside of the housing 62. As a result, it is possible to suppress deterioration of the antenna performance of the mesh wiring layer 20.

According to the present embodiment, the total thickness $T_3$ of the dielectric layer 80 and the substrate 11 is 500 μm or less. Accordingly, the dielectric layer 80 and the substrate 11 do not become excessively thick, and it is possible to suppress an increase in the thickness of the entire image display device 60.

According to the present embodiment, since the dielectric constant of the dielectric layer 80 is 3.5 or less, it is possible to effectively suppress the above-described deterioration of the antenna performance of the mesh wiring layer 20.

According to the present embodiment, the dielectric layer 80 includes the polarizing plate 72, and the polarizing plate 72 is located between the wiring substrate 10 and the touch sensor 73. Accordingly, the distance between the substrate 11 and the touch sensor 73 can be formed using the polarizing plate 72 that does not substantially include a metal. Thus, as compared with a case where the polarizing plate 72 is located between the touch sensor 73 and the self-luminous display device 61, it is possible to suppress the deterioration of the antenna performance of the mesh wiring layer 20 while suppressing an increase in the thickness of the entire image display device 60.

According to the present embodiment, the wiring substrate 10 includes the substrate 11 having transparency, and the mesh wiring layer 20 disposed on the substrate 11. Since the mesh wiring layer 20 has a mesh-like pattern defined by a conductor portion as a formation portion of an opaque conductor layer and a large number of openings, the transparency of the wiring substrate 10 is ensured. Accordingly, when the wiring substrate 10 is disposed on the self-luminous display device 61, the self-luminous display device 61 can be visually recognized through the openings 23 of the mesh wiring layer 20, and visibility of the self-luminous display device 61 is not hindered.

EXAMPLES

Next, specific examples of the present embodiment will be described.

Example 1

An image display device having the configuration illustrated in FIGS. 1 to 3 was produced. In this case, a dielectric layer included a second transparent adhesive layer, a polarizing plate, and a first transparent adhesive layer in this order from a substrate side of a wiring substrate. As the substrate of the wiring substrate, a polyethylene terephthalate substrate having a thickness of 50 μm was used. As the second transparent adhesive layer, an OCA film having a thickness of 25 μm was used. A polarizing plate manufactured by Nitto Denko Corporation and having a thickness of 100 μm was used. As the first transparent adhesive layer, an OCA film having a thickness of 25 μm was used. In this case, the dielectric layer and the substrate had a total thickness of 200 μm. The layer configuration of this image display device is as follows in order from an outer surface side.

Cover glass/decorative film/third transparent adhesive layer/wiring substrate (mesh wiring layer/substrate)/dielectric layer (second transparent adhesive layer/polarizing plate/first transparent adhesive layer)/touch sensor/self-luminous display device

Comparative Example 1

An image display device was produced in a manner similar to that in Example 1 except that the polarizing plate was located closer to the cover glass than the wiring substrate, the dielectric layer was constituted of the first transparent adhesive layer, and the thickness of the substrate and the dielectric layer was different. In this case, the dielectric layer and the substrate had a total thickness of 40 μm. The layer configuration of this image display device is as follows in order from an outer surface side.

Cover glass/decorative film/third transparent adhesive layer/polarizing plate/second transparent adhesive layer/wiring substrate (mesh wiring layer/substrate)/dielectric layer (first transparent adhesive layer)/touch sensor/self-luminous display device

Comparative Example 2

An image display device was produced in a manner similar to that in Comparative Example 1 except that the dielectric layer and the substrate had a total thickness of 550 μm. The layer configuration of this image display device is as follows in order from an outer surface side.

Cover glass/decorative film/third transparent adhesive layer/polarizing plate/second transparent adhesive layer/wiring substrate (mesh wiring layer/substrate)/dielectric layer (first transparent adhesive layer)/touch sensor/self-luminous display device Table 1 presents the results of measuring the thicknesses of the image display devices according to Example 1, Comparative Example 1, and Comparative Example 2 and the antenna functions of the image display devices. In the following table, "good" means proper, and "poor" means improper.

TABLE 1

| | Position of polarizing plate | Total thickness of dielectric layer and substrate | Thickness of image display device | Antenna function of image display device |
|---|---|---|---|---|
| Example 1 | Self-luminous display device side | 200 μm | ○ (1.0 mm) | ○ |
| Comparative Example 1 | Cover glass side | 40 μm | ○ (1.0 mm) | x |
| Comparative Example 2 | Cover glass side | 550 μm | x (1.3 mm) | ○ |

As presented in Table 1, the image display device of Example 1 was proper in the antenna function, and the thickness of the image display device was not excessively large. In the image display device of Comparative Example 1, the thickness of the image display device was not excessively large, but the antenna function was deteriorated. In the image display device of Comparative Example 2, the antenna function was proper, but the thickness of the image display device was excessively large.

[Modifications]

Next, modifications of the image display device and the wiring substrate will be described.

(First Modification)

Figure 9:
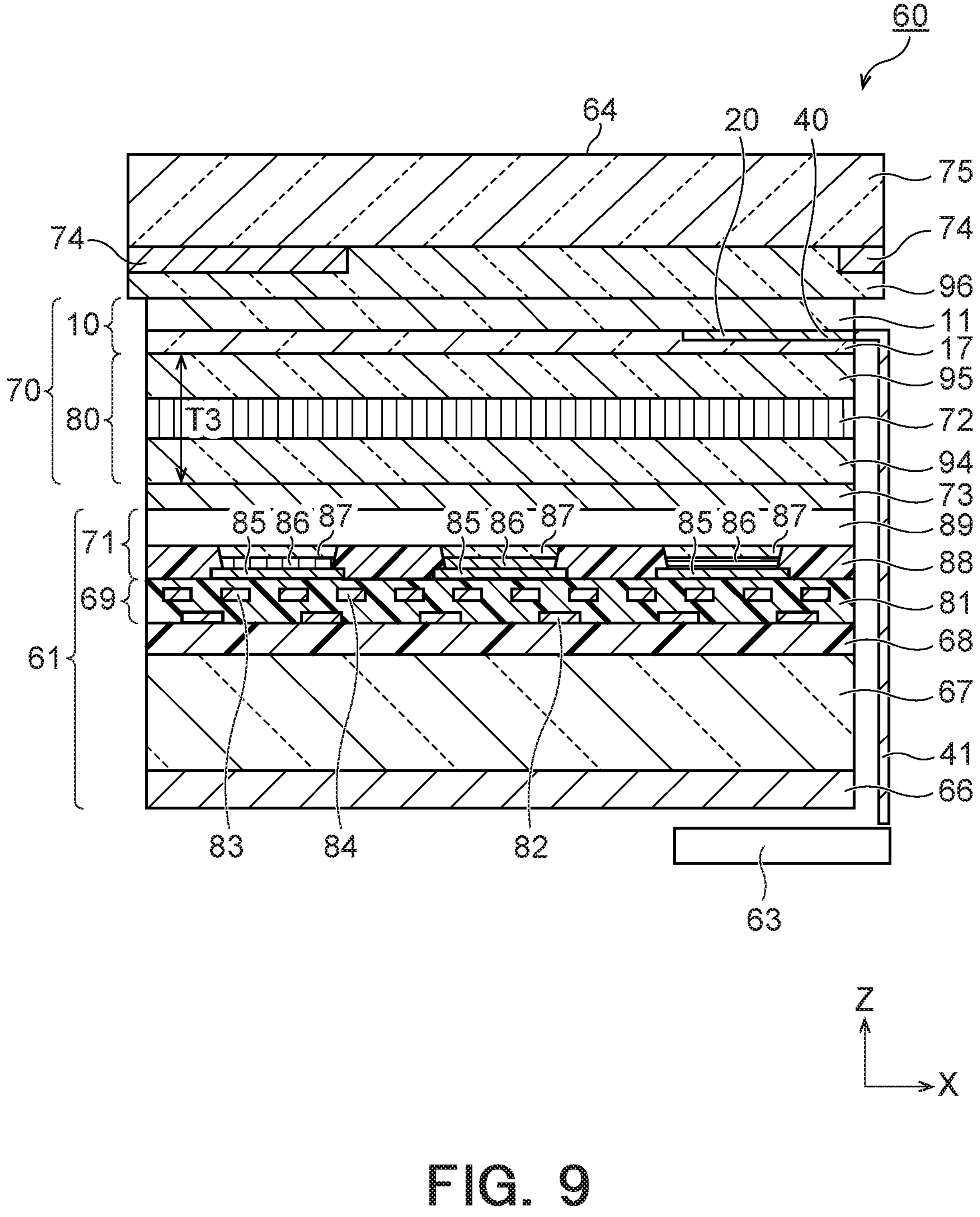
FIG. 9 is a view illustrating a section configuration of an image display device according to a modification.

FIG. 9 illustrates a modification of the image display device. The modification illustrated in FIG. 9 is different from the embodiment illustrated in FIGS. 1 to 8 in that the dielectric layer 80 is stacked on a mesh wiring layer 20 side of the wiring substrate 10, and the other configurations are substantially the same as those of the embodiment illustrated in FIGS. 1 to 8. In FIG. 9, the same portions as those illustrated in FIGS. 1 to 8 are denoted by the same reference signs, and detailed description thereof will be omitted.

In the image display device 60 illustrated in FIG. 9, the substrate 11 of the wiring substrate 10 faces a cover glass 75 side (the plus side in the Z direction), and the mesh wiring layer 20 and the power feed part 40 of the wiring substrate 10 face a dielectric layer 80 side. The dielectric layer 80 is a layer that does not substantially include a metal, and includes the first transparent adhesive layer 94, the polarizing plate 72, and the second transparent adhesive layer 95. The dielectric layer 80 has a thickness $T_3$ of 50 μm or more and 500 μm or less, and preferably 100 μm or more and 400 μm or less.

According to the present modification, the dielectric layer 80 is stacked on the mesh wiring layer 20 side of the wiring substrate 10, and the thickness $T_3$ of the dielectric layer 80 is 50 μm or more. Hence, the distance between the mesh wiring layer 20 and the touch sensor 73 that is the metal layer closest to the mesh wiring layer 20 is sufficiently increased. Accordingly, the metal included in the touch sensor 73 and the mesh wiring layer 20 are not strongly electrically coupled to each other, and it is possible to suppress weakening of the radiation of radio waves to the outside of the housing 62. As a result, it is possible to suppress deterioration of the antenna performance of the mesh wiring layer 20. Moreover, since the thickness of the dielectric layer 80 is 500 μm or less, the dielectric layer 80 does not become excessively thick, and it is possible to suppress an increase in the thickness of the entire image display device 60.

(Second Modification)

Figure 10:
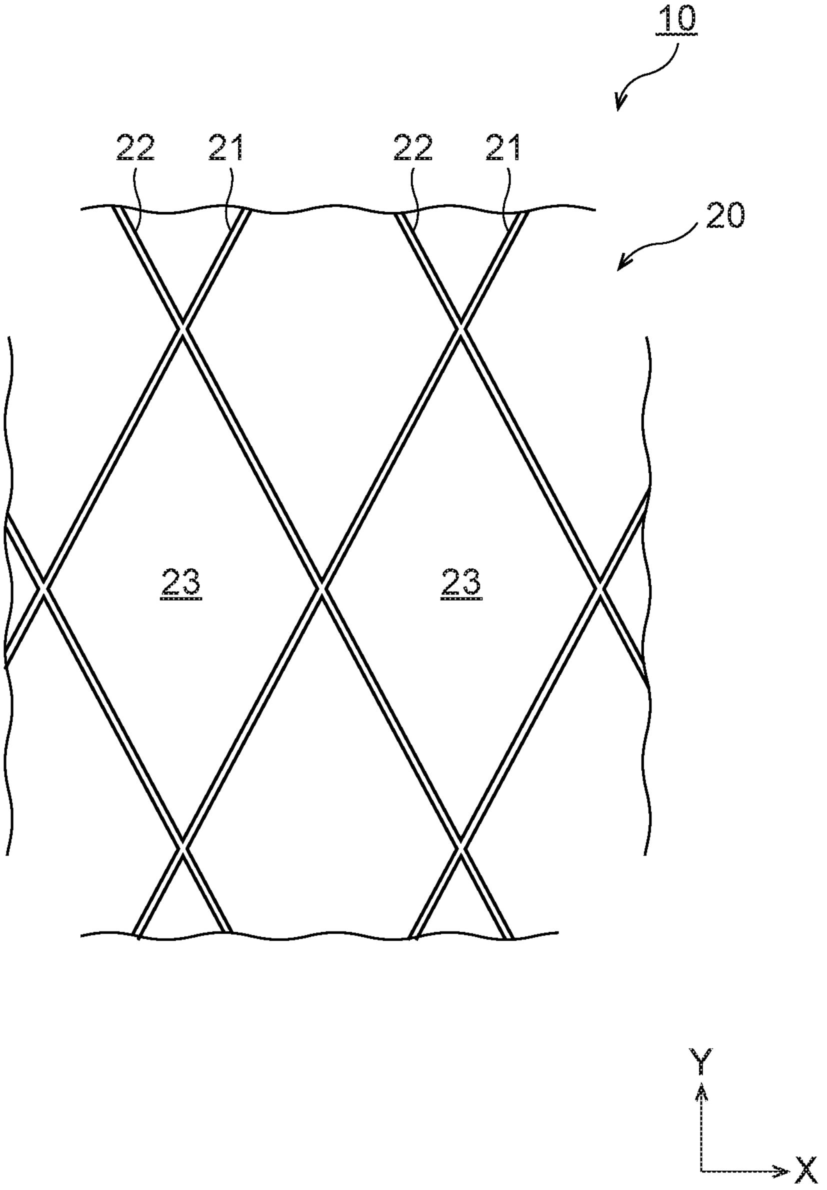
FIG. 10 is an enlarged plan view illustrating a mesh wiring layer of a wiring substrate according to a modification.

FIG. 10 illustrates a modification of the wiring substrate. In the modification illustrated in FIG. 10, the planar shape of the mesh wiring layer 20 is different, and the other configurations are substantially the same as those of the embodiment illustrated in FIGS. 1 to 8. In FIG. 10, the same portions as those illustrated in FIGS. 1 to 8 are denoted by the same reference signs, and detailed description thereof will be omitted.

FIG. 10 is an enlarged plan view illustrating the mesh wiring layer 20 according to the modification. In FIG. 10, the first direction wire 21 and the second direction wire 22 intersect with each other obliquely (not at a right angle), and each opening 23 is formed in a rhombic shape in a plan view. The first direction wire 21 and the second direction wire 22 are not parallel to either the X direction or the Y direction, but any one of the first direction wire 21 and the second direction wire 22 may be parallel to the X direction or the Y direction.

It is also possible to appropriately combine a plurality of components disclosed in the above-described embodiment and modifications as necessary. Alternatively, some components may be deleted from all the components presented in the above-described embodiment and modifications.

The invention claimed is:

1. A multilayer body for an image display device, comprising:
- a wiring substrate including a substrate having transparency, and a mesh wiring layer disposed on the substrate; and
- a dielectric layer stacked on the wiring substrate,
- wherein the dielectric layer includes, in order from the wiring substrate side, a second transparent adhesive layer, a polarizing plate, and a first transparent adhesive layer,
- the first transparent adhesive layer has a thickness of 10 μm or more and 50 μm or less,
- the polarizing plate has a thickness of 15 μm or more and 200 μm or less,
- the second transparent adhesive layer has a thickness of 15 μm or more and 150 μm or less, and
- the dielectric layer and the substrate have a total thickness of 50 μm or more and 500 μm or less.

2. The multilayer body for an image display device according to claim 1, wherein the dielectric layer has a dielectric constant of 3.5 or less.

3. An image display device comprising:
- the multilayer body for an image display device according to claim 1; and
- a self-luminous display device stacked on a dielectric layer side of the multilayer body for an image display device.

4. The image display device according to claim 3, wherein a touch sensor is disposed between the self-luminous display device and the dielectric layer of the multilayer body for an image display device.

5. A multilayer body for an image display device, comprising:
- a wiring substrate including a substrate having transparency, and a mesh wiring layer disposed on the substrate; and
- a dielectric layer stacked on the wiring substrate,
- wherein the dielectric layer includes, in order from the wiring substrate side, a second transparent adhesive layer, a polarizing plate, and a first transparent adhesive layer,
- the first transparent adhesive layer has a thickness of 10 μm or more and 50 μm or less,
- the polarizing plate has a thickness of 15 μm or more and 200 μm or less,
- the second transparent adhesive layer has a thickness of 15 μm or more and 150 μm or less, and
- the dielectric layer has a thickness of 50 μm or more and 500 μm or less.

6. The multilayer body for an image display device according to claim 5, wherein the dielectric layer has a dielectric constant of 3.5 or less.

7. An image display device comprising:
- the multilayer body for an image display device according to claim 5; and
- a self-luminous display device stacked on a dielectric layer side of the multilayer body for an image display device.

8. The image display device according to claim 7, wherein a touch sensor is disposed between the self-luminous display device and the dielectric layer of the multilayer body for an image display device.

* * * * *